United States Patent
Hamada et al.

(10) Patent No.: US 11,329,198 B2
(45) Date of Patent: May 10, 2022

(54) WAVELENGTH CONVERSION MEMBER, OPTICAL DEVICE, AND PROJECTOR

(71) Applicant: Panasonic Intellectual Property Management Co., Ltd., Osaka (JP)

(72) Inventors: Takahiro Hamada, Osaka (JP); Yukihiko Sugio, Osaka (JP); Nobuyasu Suzuki, Osaka (JP); Yoshihisa Nagasaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/414,877

(22) PCT Filed: Oct. 4, 2019

(86) PCT No.: PCT/JP2019/039322
§ 371 (c)(1),
(2) Date: Jun. 16, 2021

(87) PCT Pub. No.: WO2020/129358
PCT Pub. Date: Jun. 25, 2020

(65) Prior Publication Data
US 2022/0059729 A1    Feb. 24, 2022

(30) Foreign Application Priority Data

Dec. 18, 2018 (JP) .............................. JP2018-236356

(51) Int. Cl.
*H01L 33/50* (2010.01)
*F21V 9/30* (2018.01)
*G03B 21/20* (2006.01)

(52) U.S. Cl.
CPC .............. *H01L 33/502* (2013.01); *F21V 9/30* (2018.02); *G03B 21/204* (2013.01); *H01L 33/508* (2013.01)

(58) Field of Classification Search
CPC ......... F21V 9/30; H01L 33/502; H01L 33/508
See application file for complete search history.

(56) References Cited

U.S. PATENT DOCUMENTS

| 2014/0072812 A1 | 3/2014 | Hamada |
| 2015/0276177 A1 | 10/2015 | Maeda |

(Continued)

FOREIGN PATENT DOCUMENTS

| JP | 2014-105313 A | 6/2014 |
| JP | 5672622 B2 | 1/2015 |

(Continued)

OTHER PUBLICATIONS

International Search Report for corresponding Application No. PCT/JP2019/039322, dated Nov. 19, 2019.

(Continued)

*Primary Examiner* — Karabi Guharay
(74) *Attorney, Agent, or Firm* — Renner, Otto, Boisselle & Sklar, LLP

(57) ABSTRACT

A wavelength conversion device includes a substrate, a matrix supported by the substrate and containing inorganic material, a phosphor embedded in the matrix, and filler particles embedded in the matrix. A linear expansion coefficient of the filler particles is equal to or larger than 25 ppm/K and equal to or smaller than 790 ppm/K, and is larger than a linear expansion coefficient of the matrix. This wavelength conversion device suppresses warping of the substrate.

12 Claims, 9 Drawing Sheets

(56) References Cited

U.S. PATENT DOCUMENTS

| | | | |
|---|---|---|---|
| 2017/0023199 A1 | 1/2017 | Hamada |
| 2018/0180975 A1 | 6/2018 | Furuyama |
| 2019/0007299 A1 | 1/2019 | Rikiso |

FOREIGN PATENT DOCUMENTS

| | | |
|---|---|---|
| JP | 5799712 B2 | 9/2015 |
| JP | 2017-028251 A | 2/2017 |
| JP | 2017-163361 A | 9/2017 |
| JP | 6357835 B2 | 6/2018 |
| WO | 2014/162893 A1 | 10/2014 |
| WO | 2017/047412 A1 | 3/2017 |

OTHER PUBLICATIONS

Physical properties such as conductivity, magnetic pemeability, and coefficient of thermal expansion of stainless steel, Japan Stainless Steel Association, FAQ Article downloaded on Jun. 16, 2021 from http://www.jssa.gr.jp/contents/faq-article/q6/.

WAVELENGTH CONVERSION MEMBER, OPTICAL DEVICE, AND PROJECTOR

This application is a U.S. national stage application of the PCT international application No. PCT/JP2019/039322 filed on Oct. 4, 2019, which claims the benefit of foreign priority of Japanese patent application No. 2018-236356 filed on Dec. 18, 2018, the contents all of which are incorporated herein by reference.

TECHNICAL FIELD

The present disclosure relates to a wavelength conversion device, an optical device, and a projector.

BACKGROUND ART

Optical devices each including an excitation light source and a wavelength conversion device have been developed. The wavelength conversion device includes a phosphor embedded in a matrix. When irradiated with excitation light from the excitation light source, the phosphor emits fluorescence light having a longer wavelength than the excitation light. Attempts have been made to increase brightness of light and optical output of this type of optical device.

PTL 1 discloses a wavelength conversion element contains zinc oxide (ZnO) as material of a matrix. ZnO is inorganic material having a refractive index closer to those of phosphors, and has an excellent light transmitting property and excellent thermal conductivity. The wavelength conversion element described in PTL 1 prevents light from scattering at an interface between a phosphor and the ZnO matrix, providing that high optical output. The matrix of the wavelength conversion element described in PTL 1 is disposed on a substrate.

CITATION LIST

Patent Literature

PTL 1: Japanese Patent No. 5672622

SUMMARY

A wavelength conversion device includes a substrate, a matrix supported by the substrate and containing inorganic material, a phosphor embedded in the matrix, and filler particles embedded in the matrix. A linear expansion coefficient of the filler particles is equal to or larger than 25 ppm/K and equal to or smaller than 790 ppm/K, and is larger than a linear expansion coefficient of the matrix.

This wavelength conversion device suppresses warping of the substrate.

DETAIL DESCRIPTION OF PREFERRED EMBODIMENTS

Knowledge Underlying Present Disclosure

A wavelength conversion device obtained after forming an inorganic crystalline matrix on a substrate by a solution growth method may have a higher temperature. The temperature of the wavelength conversion device may rise when the wavelength conversion device is in use. As the temperature of the wavelength conversion device decreases, both the substrate and the matrix contract. In the case that the substrate and the matrix of the wavelength conversion device having different linear expansion coefficients, the substrate and the matrix contract by different degrees. Therefore, the decrease in temperature of the wavelength conversion device causes stress the substrate and the matrix, accordingly causing the substrate to warp. The substrate tends to largely warp especially when the matrix is formed on a large area of the substrate. Substrate may warp, for example, in the wavelength conversion element disclosed in PTL 1.

The warping of the substrate may shift a position on the wavelength conversion device that is to be irradiated with excitation light, hence decreasing light emission efficiency of the wavelength conversion device. When the substrate warps largely, the matrix may fall off from the substrate.

Exemplary embodiments of the present disclosure with reference to the drawings. The following exemplary embodiments are not restrictive of the present disclosure.

Exemplary Embodiment 1

Figure 1:
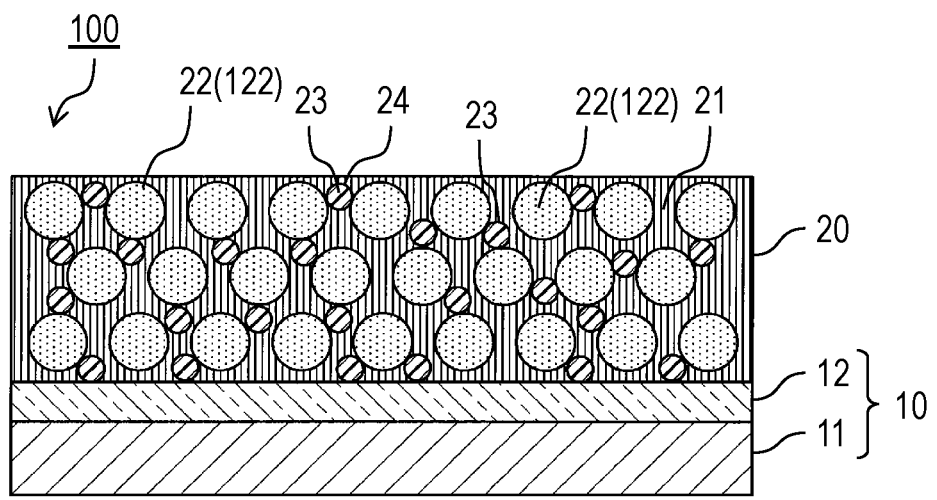
FIG. 1 is a schematic sectional view of a wavelength conversion device according to Exemplary Embodiment 1 of the present disclosure.

FIG. 1 is a schematic sectional view of wavelength conversion device 100 according to Exemplary Embodiment 1. As shown in FIG. 1, wavelength conversion device 100 includes substrate 10 and phosphor part 20. Substrate 10 supports phosphor part 20. Phosphor part 20 is disposed on substrate 10. Phosphor part 20 includes matrix 21, phosphor 22, and filler particles 23. Phosphor 22 is composed of, for example, plural particles 122. Phosphor 22 in the form of particles 122 and filler particles 23 are embedded in matrix 21. In other words, particles 122 of phosphor 22 and filler particles 23 are dispersed in matrix 21. Particles 122 of phosphor 22 and filler particles 23 are surrounded by matrix 21.

Phosphor part 20 has, for example, a layer shape. Phosphor part 20 has a thickness, for example, equal to or larger than 20 μm and equal to or smaller than 200 μm. The thickness of phosphor part 20 may be larger than 50 μm. Phosphor part 20 of layer shape has an area, e.g. equal to or larger than 0.5 mm$^2$ and equal to or smaller than 1500 mm$^2$.

Upon being irradiated with excitation light of a first wavelength band, wavelength conversion device 100 converts a portion of the excitation light into light of a second wavelength band and emits this light of the second wavelength band. The light emitted from wavelength conversion device 100 have a longer wavelength than the excitation light. The second wavelength band is different from the first wavelength band. The second wavelength band may overlap the first wavelength band. The light emitted from wavelength conversion device 100 may include not only light emitted from phosphor 22, but also the excitation light per se.

Substrate 10 includes, for example, substrate body 11 and film 12. Substrate 10 may have a larger thickness than phosphor part 20. Substrate body 11 is made of at least one material selected from the group consisting of stainless steel, composite material (Al—SiC) of aluminum and silicon carbide, composite material (Al—Si) of aluminum and silicon, composite material (AFC) of aluminum and carbon, copper (Cu), sapphire (Al$_2$O$_3$), alumina, gallium nitride (GaN), aluminum nitride (AlN), silicon (Si), aluminum (Al), glass, quartz (SiO$_2$), silicon carbide (SiC), and zinc oxide. Substrate body 11 containing copper (Cu) may further contain another chemical element, such as tungsten (W) or molybdenum (Mo). Substrate body 11 containing at least one selected from the group consisting of stainless steel, the composite material (Al—SiC) of aluminum and silicon carbide, composite material (Al—Si) of aluminum and silicon, composite material (Al—C) of aluminum and carbon, and copper (Cu) has a small thermal expansion coefficient. Substrate 11 containing at least one selected from the group consisting of stainless steel, composite material (Al—SiC) of aluminum and silicon carbide, composite material (Al—Si) of aluminum and silicon, composite material (Al—C) of aluminum and carbon, and copper (Cu) is suitable for use in a projector. Substrate body 11 may have a light transmitting property so as to transmit the excitation light and the light emitted from phosphor 22. In this case, wavelength conversion device 100 is suitably used in a transmissive optical device. Substrate 10 having no light transmitting property allows wavelength conversion device 100 to be used in a reflective optical device. Substrate body 11 may have a surface polished like a mirror.

A surface of substrate body 11 may be covered with, e.g. an antireflection film, a dichroic mirror, a metal reflection film, a reflection enhancing film, or a protective film. The antireflection film prevents reflection of the excitation light. The dichroic mirror may include plural dielectric layers. The metal reflection film reflects light and is made of metal material, such as silver or aluminum. The reflection enhancing film may include plural dielectric layers. The protective film may physically or chemically protects these films.

Film 12 functions as a base layer for forming phosphor part 20. Matrix 21 of phosphor part 20 is crystalline allows film 12 to function as a seed crystal in a crystal growth process for matrix 21. This means that film 12 is a single-crystal film or a polycrystalline film. Matrix 21 made of single-crystal ZnO or polycrystalline ZnO allows film 12 to be made of a single-crystal ZnO film or a polycrystalline ZnO film. Another chemical element may be added to film 12 in addition to Zn. The chemical element, such as Ga, Al, or B added to film 12 provides film 12 with a small electrical resistance. Film 12 may contain amorphous Zn compound or amorphous ZnO. The thickness of film 12 may range preferably from 5 nm to 2000 nm or more preferably from 5 nm to 200 nm. The thinner film 12 is, the larger the distance between phosphor part 20 and substrate body 11 is, accordingly providing high thermal conductivity. In the case that substrate body 11 functions as a seed crystal, the device may not necessarily include film 12. Substrate body 11 made of, e.g. crystalline GaN or crystalline ZnO allows matrix 21 made of crystalline ZnO to be formed directly on substrate body 11. Even when matrix 21 is not crystalline, the device may not necessarily include film 12.

Linear expansion coefficient α3 of substrate 10 is not particularly limited. Linear expansion coefficient α3 of substrate 10 may be larger than linear expansion coefficient α1 of matrix 21 and smaller than linear expansion coefficient α2 of filler particles 23. The relation of linear expansion coefficients α1, α2, α3 may be determined, for example, based on respective mean values of the linear expansion coefficients measured in the same temperature range. The relation of linear expansion coefficients α1, α2, α3 and linear expansion coefficient α4 of phosphor 22 may be determined, for example, based on respective mean values of the linear expansion coefficients measured in the same temperature range. The above-mentioned temperature range may be determined depending on a temperature at which matrix 21 is formed or wavelength conversion device 100 is used. Linear expansion coefficient α3 of substrate 10 may be equal to or larger than 0.5 ppm/K and equal to or smaller than 24 ppm/K, or equal to or larger than 9.9 ppm/K and equal to or smaller than 17.8 ppm/K. Substrate body 11 of substrate 10 has a sufficiently larger thickness than film 12. For this reason, linear expansion coefficient α3 of substrate 10 may be regarded as a linear expansion coefficient of substrate body 11 of wavelength conversion device 100. In the present disclosure, the linear expansion coefficient of substrate body 11 may also be referred to as "linear expansion coefficient α3".

Linear expansion coefficient α3 of substrate body 11 may be measured by, for example, a method below that conforms to Japanese Industrial Standard (JIS) Z2285:2003. A test piece having the same composition as substrate body 11 is prepared. The test piece has a shape specified in JIS Z2285:2003. A linear expansion coefficient of the test piece is measured by a method specified in JIS Z2285:2003 in a temperature range, for example, from 298 K to 363 K. The measured linear expansion coefficient of the test piece may be considered as linear expansion coefficient α3 of substrate body 11. In the present disclosure, the above method for measuring linear expansion coefficient α3 of substrate body 11 is not limited. In the case that substrate body 11 has a linear expansion coefficient along a thickness of substrate body 11 different from a linear expansion coefficient along a surface of substrate body 11 perpendicular to the thickness, the linear expansion coefficient along the surface of substrate body 11 is adopted as linear expansion coefficient α3 of substrate body 11 in the present disclosure.

Table 1 shows typical values of the linear expansion coefficient of materials which may be contained in substrate body 11. In Table 1, a lower limit for the linear expansion coefficient of stainless steel is a mean value of a linear expansion coefficient in a range from 0° C. to 100° C. An upper limit for a linear expansion coefficient of stainless steel is a mean value of the linear expansion coefficient in a range from 0° C. to 316° C.

TABLE 1

| Material of Substrate Body | | Linear Expansion Coefficient (ppm/K) |
|---|---|---|
| Glass | | 8.5 |
| Single-Crystal Sapphire (Al$_2$O$_3$) | | 7-7.7 |
| Alumina Ceramic (Al$_2$O$_3$) | | 7.5-8.2 |
| Polyimide | | 25 |
| Al | | 23 |
| Cu | | 17 |
| Al—SiC (70Al—30SiC) | | 14 |
| Al—Si (60Al—40Si) | | 13 |
| Al—C | | 11 |
| Stainless Steel | SUS304 | 17.3-17.8 |
| | SUS316 | 16.0-16.2 |
| | SUS3105 | 14.4-16.4 |
| | SUS405 | 10.8-11.5 |
| | SUS430 | 10.4-11.0 |
| | SUS403 | 9.9-10.1 |
| | SUS410 | 9.9-10.1 |
| Crystalline Silicon (Si) | | 2.4-3 |
| Quartz (SiO$_2$) | | 0.47-0.59 |

Particles 122 of phosphor 22 are dispersed in matrix 21 of phosphor part 20. In FIG. 1, particles 122 of phosphor 22 are located away from one another. Particles 122 of phosphor 22 may contact one another. Filler particles 23 may be disposed between two particles 122 of phosphor 22, and may be disposed between substrate of each of particles 122 of phosphor 22 and substrate 10. Filler particles 23 may contact particles 122 of phosphor 22. Filler particles 23 may contact substrate 10. Filler particles 23 may be located away from one another. Filler particles 23 may contact one another. Particles 122 of phosphor 22 and filler particles 23 may be piled up like a stone wall.

A material of phosphor 22 is not particularly limited. Various luminescent substances may be used for phosphor 22. Specifically, a luminescent substance, such as Y$_3$Al$_5$O$_{12}$:Ce (YAG), Y$_3$(Al, Ga)5O$_{12}$:Ce (GYAG), Lu$_3$Al$_5$O$_{12}$:Ce (LuAG), (Si, Al)$_6$(O, N)$_8$:Eu (β-SiAlON), (L$_a$, Y)$_3$Si$_6$N$_{11}$:Ce (LYSN), or Lu$_2$CaMg$_2$Si$_3$O$_{12}$:Ce (LCMS) can be used. Phosphor 22 may further contain, in addition to the luminescent substance, another material having a light transmitting property. Examples of the material having the light transmitting property include glass, SiO$_2$, and Al$_2$O$_3$. Phosphor 22 may contain plural kinds of phosphor that have different compositions. Selection of the material of phosphor 22 depends on chromaticity of light to be emitted from wavelength conversion device 100.

Particles 122 of phosphor 22 have an average particle diameter ranging, e.g. from 0.1 μm to 50 μm. The average particle diameter of particles 122 of phosphor 22 may be larger than 10 μm. The average particle diameter of particles 122 of phosphor 22 may be ascertained, for example, by a method below. A section of wavelength conversion device 100 is observed first with a scanning electron microscope. Image processing is used to calculate an area of specified particle 122 of phosphor 22 appearing in an obtained electron microscope image. A diameter of a circle having an area identical to the calculated area is determined as a particle size (diameter) of specified particle 122 of phosphor 22. Particle sizes of any number of phosphor particles 122 (e.g., fifty phosphor particles 122) are calculated, and an average of those calculated values is considered as the average particle diameter of particles 122 of phosphor 22. In the present disclosure, the shapes of particles 122 of phosphor 22 are not limited. Particles 122 of phosphor 22 may have spherical, ellipsoidal, scaly or fibrous shapes. In the present disclosure, the above method for measuring the average particle diameter is not limited.

The ratio of the total volume of particles 122 of phosphor 22 to the volume of phosphor part 20 is not particularly limited, and may be equal to or larger than 0.1 and be equal to or smaller than 0.9, or alternatively may be equal to or larger than 0.3 or equal to or smaller than 0.7.

Linear expansion coefficient α4 of phosphor 22 is not particularly limited. Linear expansion coefficient α4 of phosphor 22 may be smaller than linear expansion coefficient α2 of filler particles 23. Linear expansion coefficient α4 of phosphor 22 may be smaller than or equal to 10 ppm/K. A lower limit for linear expansion coefficient α4 of phosphor 22 is, for example, 1 ppm/K. Linear expansion coefficient α4 of phosphor 22 can be measured by the same method as for linear expansion coefficient α3 of substrate body 11. Table 2 shows typical values of the linear expansion coefficient of materials to be contained in phosphor 22.

TABLE 2

| Material of Phosphor | Linear Expansion Coefficient (ppm/K) |
|---|---|
| YAG | 8 |
| β-SiAlON | 3.2 |

Filler particles 23 are dispersed in matrix 21 of phosphor part 20. Filler particles 23 contain resin material. The resin material may be contained as a primary ingredient of filler particles 23. The term "primary ingredient" refers to an ingredient that is most abundant in terms of its weight ratio in filler particles 23. For example, filler particles 23 are substantially made of the resin material. The term "substantially made of" refers to exclusion of any other ingredient that modifies an essential feature of the material mentioned. However, filler particles 23 may further contain impurity in addition to the resin material. The resin material may contain thermoplastic resin. The resin material may contain thermosetting resin. The thermoplastic resin includes, for example, at least one selected from the group consisting of polystyrene (PS), methacrylate resin, and polycarbonate (PC). The thermoplastic resin may include a polyimide or polytetrafluoroethylene (PTFE). The methacrylate resin includes, for example, polymethyl methacrylate (PMMA). Filler particles 23 containing the thermoplastic resin increases a strength of wavelength conversion device 100. The thermoplastic resin may include thermoplastic elastomer. The thermoplastic elastomer may be styrene elastomer, olefin elastomer, vinyl chloride elastomer, urethane elastomer, ester elastomer, or amide elastomer. The term "elastomer" refers to material having rubber elasticity.

The thermosetting resin includes, for example, at least one selected from the group consisting of silicone resin and epoxy resin. The silicone resin is, for example, polymer compound including siloxane bonds. The silicone resin has, for example, the siloxane bonds as a main backbone. The silicone resin may include dimethylpolysiloxane and polyorganosilsesquioxane. The polyorganosilsesquioxane has, for example, a three-dimensional network structure having the siloxane bonds as cross links. This structure is expressed, for example, by the general formula $(RSiO_{3/2})_n$. In this general formula, R is, for example, an alkyl group.

The thermosetting resin may include thermosetting elastomer. The thermosetting elastomer may include urethane rubber, silicone rubber, and fluororubber. The silicone rubber is silicone resin having rubber elasticity. The silicone rubber has, for example, a cross-linked dimethylpolysiloxane structure.

Commercially-available filler particles including silicone resin or silicone rubber are, e.g. the KMP series, the KSP series, and the X-52 series from Shin-Etsu Chemical Co., Ltd., and the EP series, the TREFIL series, and 30-424 from Additive Dow Corning Toray Co., Ltd. The resin material containing the polymer compound including the siloxane bonds provides filler particles 23 with excellent heat resistance.

Filler particle 23 may have surface 24 modified with functional group, thereby having excellent dispersibility. Surface 24 modified with the functional group suppresses or prevents agglomeration of filler particles 23. The functional group modifying surface 24 may include epoxy group, (meth)acryloyl group, and methyl group.

An average particle diameter of filler particles 23 may range from 0.1 µm to 20 µm or from 1.0 µm to 10 µm. In an example, the average particle diameter of filler particles 23 is smaller than the average particle diameter of particles 122 of phosphor 22. Ratio (D2/D1) of average particle diameter D2 of filler particles 23 to average particle diameter D1 of particles 122 of phosphor 22 ranges, for example, from 0.01 to 0.90. The average particle diameter of filler particles 23 may be measured by the same method as for the average particle diameter of particles 122 of phosphor 22. Total volume V1 of particles 122 of phosphor 22 and total volume V2 of filler particles 23 may provide a value of V2/(V1+V2) ranging, e.g. from 0.01 to 0.70 or from 0.05 to 0.16. Filler particles 23 have a specific gravity ranging, for example, from 0.5 g/cm³ to 1.5 g/cm³. Total volume V1 of particles 122 of phosphor 22 is the volume of whole phosphor 22.

The ratio of the total volume of filler particles 23 to the volume of phosphor part 20 is not particularly limited. The ratio may be equal to or larger than 0.005 and equal to or smaller than 0.7, or alternatively, be equal to or larger than 0.01 and equal to or smaller than 0.4.

Figure 2:
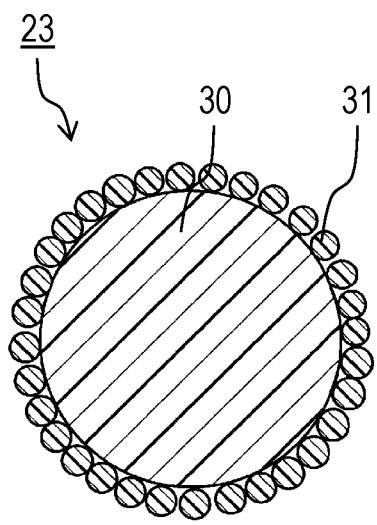
FIG. 2 is a sectional view of a filler particle of the wavelength conversion device illustrated in FIG. 1.

In the present disclosure, the shape of filler particle 23 is not particularly limited. Filler particle 23 may have a spherical, ellipsoidal, scaly or fibrous shape. FIG. 2 illustrates a section of filler particle 23. As illustrated in FIG. 2, filler particle 23 may include core 30 and shell 31 covering core 30. A surface of core 30 may be entirely or partly covered with shell 31. In an example, shell 31 contacts core 30. In an example, a composition of core 30 is different from a composition of shell 31. For example, core 30 is made of silicone rubber while shell 31 is made of silicone resin other than silicone rubber. Core 30 may have a spherical shape. In FIG. 2, shell 31 is composed of plural particles. Shell 31 may have a layer shape. The particles constituting shell 31 have an average particle diameter ranging, for example, from 1 µm to 1 µm. Shells 31 provide filler particles 23 with excellent dispersibility. Shells 31 suppresses or prevents agglomeration of filler particles 23.

Linear expansion coefficient α2 of filler particles 23 is equal to or larger than 25 ppm/K and equal to or smaller than 790 ppm/K, and is larger than linear expansion coefficient α1 of matrix 21. Linear expansion coefficient α2 of filler particles 23 may be equal to or larger than 25 ppm/K and equal to or smaller than 400 ppm/K, or alternatively be equal to or larger than 50 ppm/K and equal to or smaller than 400 ppm/K. Linear expansion coefficient α2 may be equal to or larger than 200 ppm/K. Linear expansion coefficient α2 of filler particles 23 may be selected depending on the temperature at which matrix 21 is formed or wavelength conversion device 100 is used.

Linear expansion coefficient α2 of filler particles 23 may be measured by, for example, a method below that conforms to JIS K7197:2012. A test piece having the same composition as filler particle 23 is prepared. The test piece has a shape specified in JIS K7197:2012. A linear expansion coefficient of the test piece is measured by the method specified in JIS K7197:2012 in s temperature range, for example, from 298 K to 363 K. The measured linear expansion coefficient of the test piece may be regarded as linear expansion coefficient α2 of filler particles 23. In the present disclosure, the above method for measuring linear expansion coefficient α2 of filler particles 23, however, is not limited.

Table 3 shows typical literature values of the linear expansion coefficient of materials to be contained in filler particles 23.

TABLE 3

| Material of Filler Particles | Linear Expansion Coefficient (ppm/K) |
|---|---|
| Polyimide | 25 |
| Polystyrene | 50-83 |
| PMMA | 50-90 |
| Silicone Rubber | 250-400 |
| PTFE | 86-790 |

The resin material containing the thermoplastic elastomer or the thermosetting elastomer provides filler particles 23 with rubber elasticity. Filler particles 23 may have a rubber hardness ranging from 10 to 90 or from 30 to 75. The rubber hardness of filler particles 23 can be measured, for example, by a method below conforming to Japanese Industrial Standard (JIS) K6253-3:2012. A test piece having the same composition as filler particle 23 is prepared first. The test piece has a shape as specified in JIS K6253-3:2012. A rubber hardness of the test piece is measured, for example, by a method with a type A durometer as specified in JIS K6253-3:2012. The obtained rubber hardness of the test piece can be considered as the rubber hardness of filler particles 23. In the present disclosure, the above method for measuring the rubber hardness, however, is not limited to above.

Filler particles 23 have glass transition temperature Tg that is not particularly limited. The thermoplastic resin allows filler particles 23 to have glass transition temperature Tg ranging, for example, from 50° C. to 300° C. Filler particles 23 containing the thermosetting elastomer have glass transition temperature Tg lower than or equal to 30° C. or lower than or equal to 0° C. Silicone rubber has glass transition temperature Tg of −125° C. A lower limit for glass transition temperature Tg of filler particles 23 is, for example, −273° C. Glass transition temperature Tg of filler particles 23 lower than a room temperature provides filler particles 23 with excellent adhesiveness at the room temperature. In the present disclosure, the room temperature ranges from 25° C. to 30° C. Glass transition temperature Tg of filler particles 23 can be measured, for example, by a method conforming to JIS K7121:1987 with a differential scanning calorimeter (DSC). When ascertaining definite glass transition temperature Tg of filler particles 23 that include, for example, silicone rubber and may have glass transition temperature Tg lower than or equal to 0° C., a DSC capable of measuring glass transition temperature Tg even at a temperature lower than or equal to 0° C. is used. In the present disclosure, the above method for measuring glass transition temperature Tg, however, is not limited to above.

When irradiated with the excitation light, filler particles 23 emit no fluorescence light or only fluorescence light with negligible intensity. A light absorptivity of filler particles 23 is not particularly limited. For light with a wavelength of 550 nm, the absorptivity of filler particles 23 is preferably less than or equal to 25%, more preferably less than or equal to 10%, or even more preferably less than or equal to 1%. Filler particles 23 may substantially absorb no light with the wavelength of 550 nm. For light with a wavelength of 450 nm, the absorptivity of filler particles 23 is preferably less than or equal to 25%, more preferably less than or equal to 10%, or even more preferably less than or equal to 1%. Filler particles 23 may substantially absorb no light with the wavelength of 450 nm.

The light absorptivity of filler particles 23 can be measured, for example, with a commercially available absolute PL quantum yield measurement device. The absolute PL quantum yield measurement device utilizes a photoluminescence (PL) method for measuring an absolute value of a luminescence quantum yield of a sample made of, e.g. as a luminescence material to be used for a light-emitting diode (LED). A luminescence quantum yield of powder sample can be measured by a method below that uses a measurement sample holder and a petri dish for power measurement. The sample is placed in the petri dish first. Next, this petri dish is placed inside an integrating sphere. The sample is irradiated with separated excitation light with a particular wavelength that originates from a xenon light source. Light emitted from the sample is measured. Thus the luminescence quantum yield of the sample can be measured. The light absorptivity of filler particles 23 can be measured, for example, by a method below. An empty petri dish containing no sample is placed inside the integrating sphere first. Luminescence quantum yield measurement is performed with the petri dish being empty. This enables a photon count of excitation light to be measured in the absence of the sample. Next, filler particles 23 are placed as a sample in the petri dish, and this petri dish is placed inside the integrating sphere. A luminescence quantum yield of filler particles 23 is measured. This enables a photon count of the excitation light to be measured in the presence of filler particles 23. From these measurement results, a ratio of a photon count absorbed by filler particles 23 to the photon count of the excitation light with which filler particles 23 have been irradiated may be calculated. This ratio may be considered as the light absorptivity of filler particles 23. The petri dish is made of, for example, synthetic quartz that absorbs less light in a measurement wavelength range. The bottom of the petri dish has, for example, a circular shape in plan view. In plan view, the bottom of the petri dish has a diameter of, for example, about 17 mm. The petri dish has a thickness of, for example, about 5 mm. The petri dish may have a lid.

For light with a wavelength of 550 nm, an absorptivity of filler particles 23 that have been heated at an ambient temperature of 200° C. for 24 hours is preferably less than or equal to 25%, more preferably less than or equal to 10%, or even more preferably less than or equal to 1%. For light with the wavelength of 550 nm, an absorptivity of filler particles 23 that have been heated at an ambient temperature of 240° C. for 24 hours is preferably less than or equal to 25%, more preferably less than or equal to 10%, or even more preferably less than or equal to 1%.

Matrix 21 contains inorganic material. The inorganic material may include inorganic crystal. The inorganic material includes, for example, at least one selected from the group consisting of ZnO, $SiO_2$, $Al_2O_3$, $SnO_2$, $TiO_2$, PbO, $B_2O_3$, $P_2O_5$, $TeO_2$, $V_2O_5$, $Bi_2O_3$, $Ag_2O$, $Tl_2O$, and BaO. Matrix 21 may contain glass as inorganic material.

Matrix 21 contains, for example, zinc oxide (ZnO). ZnO is suitable to material of matrix 21 in view of transparency and thermal conductivity. ZnO has high thermal conductivity. Therefore, ZnO as the material of matrix 21 enables heat to be easily let out of phosphor part 20 (mainly toward substrate 10), accordingly reducing or maintaining temperature of phosphor 22. ZnO may be contained as a primary ingredient of matrix 21. For example, matrix 21 is substantially made of ZnO. Matrix 21 may further contain impurity in addition to ZnO.

ZnO serving as the material of matrix 21 is single-crystal ZnO or polycrystalline ZnO. ZnO has a wurtzite crystal structure. When formed by crystal growth, matrix 21 has, for example, a crystal structure corresponding with a crystal structure of film 12. This means that when c-axis oriented polycrystalline ZnO is used as film 12, matrix 21 has c-axis oriented polycrystalline ZnO. The term "c-axis oriented ZnO" means that a plane parallel to a main surface of substrate 10 is a c-plane. The term "main surface" of substrate 10 refers to a surface with the largest area. Matrix 21 containing c-axis oriented polycrystalline ZnO provides phosphor part 20 with small or no internal light scattering, providing high optical output.

Polycrystalline ZnO oriented in c-axis contains plural columnar crystal grains oriented in a c-axis. This oriented polycrystalline ZnO oriented in c-axis has fewer grain boundaries extending in a c-axis. The term "columnar crystal grains oriented in a c-axis oriented" refers to tall ZnO crystal grains formed on substrate 10 as a result of faster ZnO growth along a c-axis than ZnO growth along an a-axis. The c-axis of each ZnO crystal grain is parallel to a direction normal to substrate 10. In other words, the c-axis of the ZnO crystal grain is parallel to the direction normal to a surface of phosphor part 20 configured to receive excitation light. Whether or not ZnO is c-axis oriented crystalline can be ascertained by X-ray diffraction (XRD) measurement (2θ/ω scan). ZnO is determined to be c-axis oriented crystalline ZnO when diffraction peaks for ZnO obtained from an XRD measurement result show that diffraction peak intensity resulting from the c-plane of ZnO is greater than diffraction peak intensities resulting from other planes of ZnO than the c-plane. International Publication No. WO2013/172025 discloses in detail a matrix made of polycrystalline ZnO oriented in a c-axis.

The ratio of the volume of matrix 21 to the volume of phosphor part 20 is not particularly limited, and may be equal to or larger than 0.1 and equal to or smaller than 0.9, or alternatively, be equal to or larger than 0.3 and equal to or smaller than 0.7.

Linear expansion coefficient α1 of matrix 21 is smaller than linear expansion coefficient α2 of filler particles 23. Linear expansion coefficient α1 of matrix 21 is, for example, smaller than or equal to 9.8 ppm/K. A lower limit for linear expansion coefficient α1 of matrix 21 is, for example, 2 ppm/K. Linear expansion coefficient α1 of matrix 21 may be measured by the same method as linear expansion coefficient α3 of substrate body 11. Table 4 shows typical literature values for the linear expansion coefficient for materials to be contained in matrix 21.

TABLE 4

| Material of Matrix | Linear Expansion Coefficient (ppm/K) |
|---|---|
| Glass | 8.5 |
| Single-crystal Sapphire (Al$_2$O$_3$) | 7-7.7 |
| Alumina Ceramic (Al$_2$O$_3$) | 7.5-8.2 |
| ZnO | 3-4 |

Linear expansion coefficient α5 of phosphor part 20 of wavelength conversion device 100 is not particularly limited. Linear expansion coefficient α5 of phosphor part 20 may be equal to or larger than 2 ppm/K and equal to or smaller than 25 ppm/K, or alternatively, be equal to or larger than 3 ppm/K and equal to or smaller than 13 ppm/K. For example, linear expansion coefficient α5 of phosphor part 20 may be calculated from linear expansion coefficient α1 of matrix 21, linear expansion coefficient α2 of filler particles 23, and linear expansion coefficient α4 of phosphor 22 by the following formula.

$$\alpha 5 = \alpha 1 \times P1 + \alpha 2 \times P2 + \alpha 4 \times P3$$

In the above formula, P1 is the ratio of the volume of matrix 21 to the volume of phosphor part 20. P2 is the ratio of the total volume of filler particles 23 to the volume of phosphor part 20. P3 is the ratio of the volume of phosphor 22 to the volume of phosphor part 20.

The difference between linear expansion coefficient α5 of phosphor part 20 and linear expansion coefficient α3 of substrate 10 is not particularly limited and, may be smaller than or equal to 10 ppm/K or smaller than or equal to 3 ppm/K. Linear expansion coefficient α5 of phosphor part 20 may be substantially identical to linear expansion coefficient α3 of substrate 10.

Figure 3A:
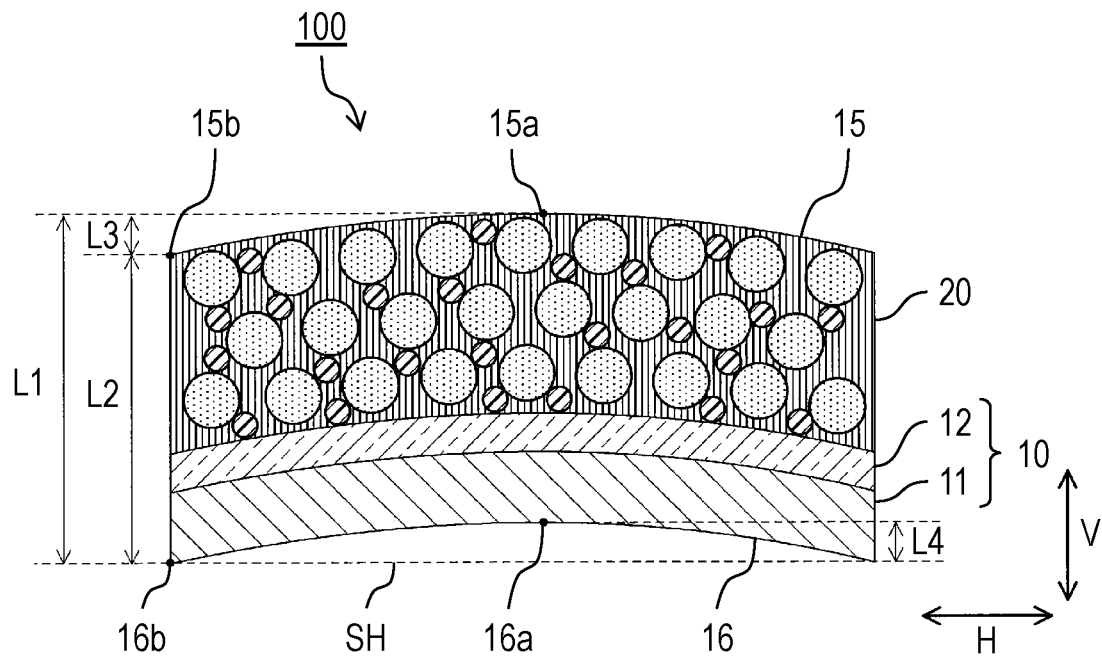
FIG. 3A illustrates a degree of warping of a substrate in the wavelength conversion device according to Embodiment 1 of the present disclosure.

Wavelength conversion device 100 according to the present embodiment hardly allows substrate 10 to warp. FIG. 3A illustrates a warping of substrate 10 of wavelength conversion device 100. Substrate 10 shown in FIG. 3A warps convexly, having a convex upper surface protruding upward, with phosphor part 20 disposed above substrate 10. The degree of warping of substrate 10 may be evaluated, for example, as follows. Wavelength conversion device 100 is first placed on plane SH extending in horizontal direction H. A part of upper surface 15 of phosphor part 20 that is located uppermost in vertical direction V is defined as top 15a. A part of upper surface 15 of phosphor part 20 located farthest down in vertical direction V is defined as valley 15b. Next, a part of lower surface 16 of substrate 10 that is located uppermost in vertical direction V is defined as top 16a. A part of lower surface 16 of substrate 10 that is located farthest down in vertical direction V is defined as base 16b. Distance L1 between top 15a and base 16b in vertical direction V is determined. Distance L2 between valley 15b and base 16b along in direction V is determined. A difference between distances L1 and L2 is calculated. The difference between distances L1 and L2 corresponds to distance L3 between top 15a and valley 15b in vertical direction V. Distance L4 between top 16a and base 16b of substrate body 11 in vertical direction V may be considered as distance L3. Therefore, the degree of warping of substrate 10 can be evaluated based on distance L3 or L4.

The degree of warping of substrate 10 may also be evaluated, for example, in a manner below. Wavelength conversion device 100 is first placed on plane SH extending in horizontal direction H. Apart of the upper surface of substrate 10 that is located uppermost in vertical direction V is defined as a substrate top. A part of the upper surface of substrate 10 that is located farthest down in vertical direction V is defined as a substrate valley. A distance between the substrate top and the substrate valley along vertical direction V is determined. The degree of warping of substrate 10 may be evaluated based on this distance.

Figure 3B:
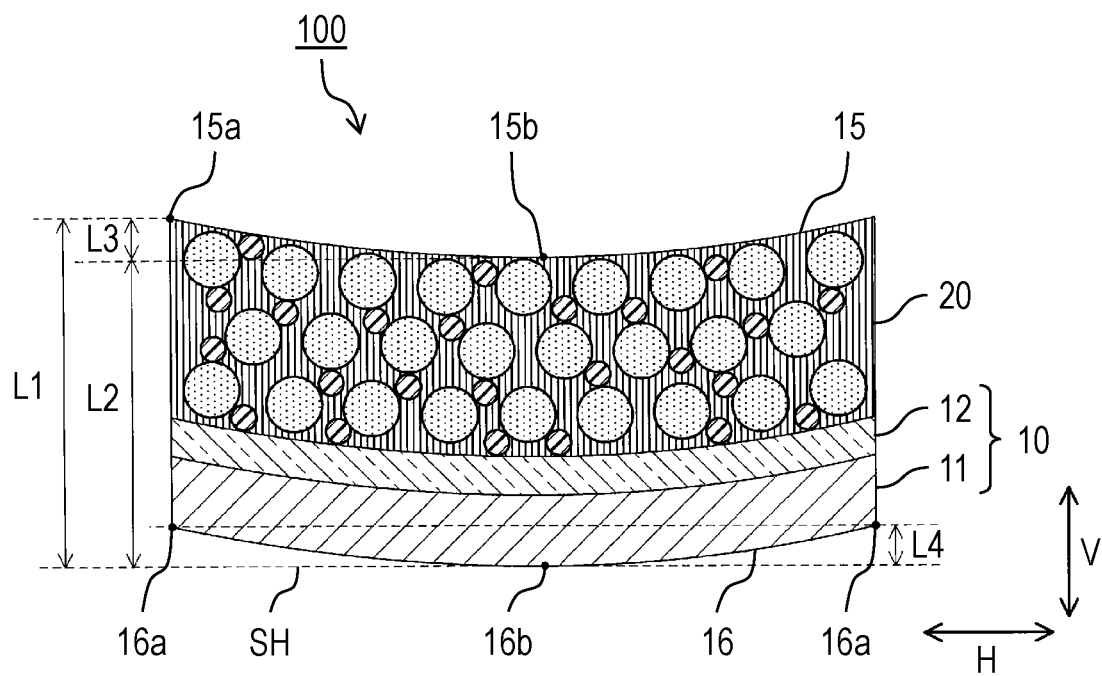
FIG. 3B illustrates a degree of warping of the substrate in the wavelength conversion device according to Embodiment 1 of the present disclosure.

FIG. 3B illustrates substrate 10 concavely warping with phosphor part 20 disposed above substrate 10. Even in concavely warping substrate 10 having an upper surface that is concave downward, distance L4 may be calculated in the same way as described above. Distance L4 corresponds to a difference between distance L1 and a distance between tops 15a and 16a in vertical direction V. Distance L3 of phosphor part 20 can be regarded as distance L4. Therefore, the degree of warping of substrate 10 may be evaluated based on distance L3 or L4. In accordance with the present disclosure, the above methods for measuring the degree of warping of substrate 10, however, are not limited.

Distance L3 of wavelength conversion device 100 is preferably smaller than or equal to 100 μm, more preferably smaller than or equal to 50 μm, or even more preferably smaller than or equal to 30 μm. Distance L3 may substantially be 0 μm. This means that distance L1 may be substantially identical to distance L2.

A light emission efficiency of wavelength conversion device 100 is preferably more than or equal to 85% or more preferably more than or equal to 90%. In the present disclosure, the light emission efficiency of wavelength conversion device 100 refers to a ratio of a photon count of fluorescence light emitted from wavelength conversion device 100 to an excitation light photon count absorbed by wavelength conversion device 100 when wavelength conversion device 100 is irradiated with excitation light. The light emission efficiency of wavelength conversion device 100 can be measured, for example, with a multichannel spectroscope. The light emission efficiency of wavelength conversion device 100 is a value obtained when wavelength conversion device 100 is irradiated with excitation light having an energy density of 2 W/mm$^2$, for example.

A light emission efficiency of wavelength conversion device 100 that has been heated at an ambient temperature of 240° C. for 24 hours is preferably more than or equal to 85% or more preferably more than or equal to 90%.

A method for manufacturing wavelength conversion device 100 will be described below.

Substrate 10 is prepared first. A crystalline ZnO film, for example, constituting film 12 is formed on substrate body 11. Vapor phase deposition is used as a method for forming the ZnO film, and examples of the vapor phase deposition include vapor deposition, electron-beam vapor deposition, reactive plasma deposition, ion assisted deposition, sputtering, and pulsed laser deposition. Film 12 may be formed by a method below. A sol containing precursor, such as a zinc alkoxide, is prepared first. The sol is applied to substrate body 11 by printing to form a coating film. Next, the coating film is heat treated, thereby providing film 12. Film 12 may be single-crystal ZnO film or polycrystalline ZnO film.

Phosphor part 20 is formed on substrate 10 (film 12). Particles 122 of phosphor 22 and filler particles 23 are deposited on substrate 10. For example, a dispersion solution containing particles 122 of phosphor 22 and filler particles 23 is prepared. Substrate 10 is disposed in the dispersion solution, and an electrophoresis method is used to deposit particles 122 of phosphor 22 and filler particles 23 onto substrate 10. Particles 122 of phosphor 22 and filler particles 23 are thus deposited on substrate 10. Alternatively, particles 122 of phosphor 22 and filler particles 23 are disposed in the dispersion solution with substrate 10 to deposit particles 122 of phosphor 22 and filler particles 23 on substrate 10. Alternatively, a thick-film formation method, such as printing, utilizing coating liquid containing particles 122 of phosphor 22 and filler particles 23 to deposit particles 122 of phosphor 22 and filler particles 23 on substrate 10.

Next, matrix 21 is formed such that filler particles 23 and particles 122 of phosphor 22 are embedded in matrix 21, thereby providing phosphor part 20. In the case that matrix 21 contains glass, phosphor part 20 may be made by a method below. Sol containing precursor, such as silicon alkoxide, is prepared first. The sol is applied onto filler particles 23 and particles 122 of phosphor 22. The sol is gelled and is baked, thereby providing phosphor part 20. In the case that matrix 21 contains inorganic material other than glass, phosphor part 20 may be formed with sol containing alkoxide in the same way as described above. Spaces among filler particles 23 and particles 122 of phosphor 22 are filled with glass having a low melting point and containing inorganic material so as to form phosphor part 20.

In the case that matrix 21 contains zinc oxide, a solution growth method using solution containing Zn ions is a usable method for forming matrix 21. Examples of the solution growth method include chemical bath deposition that is performed under atmospheric pressure, hydrothermal synthesis that is performed under a pressure higher than or equal to the atmospheric pressure, and electrochemical deposition that involves voltage or current application. The solution to be used for crystal growth is, for example, aqueous zinc nitrate ($Zn(NO_3)_2$) solution containing hexamethylenetetramine ($C_6H_{12}N_4$). The aqueous zinc nitrate solution has a pH ranging, for example, from 5 to 7. The solution growth method provides the crystal growth of matrix 21 on film 12. Phosphor part 20 is thus obtained. Japanese Patent Laid-Open Publication No. 2004-315342 discloses a solution growth method in detail.

Figure 4:
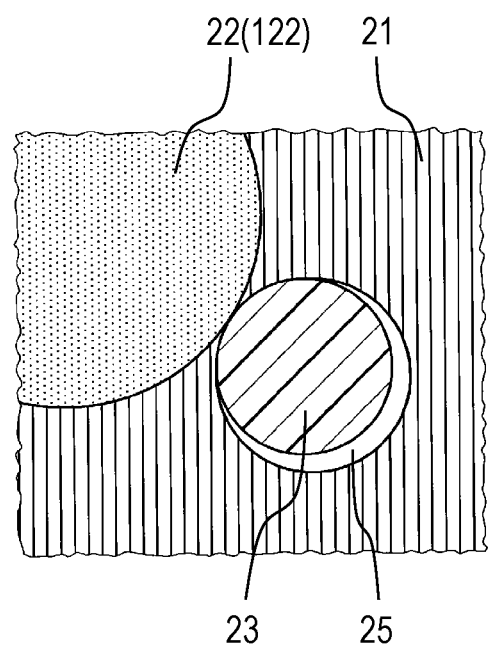
FIG. 4 illustrates a mechanism for reducing or preventing warping of a substrate of the wavelength conversion device according to Embodiment 1 of the present disclosure.

FIG. 4 illustrates a mechanism for suppressing warping of substrate 10 of wavelength conversion device 100. Wavelength conversion device 100 obtained after formation of phosphor part 20 with the solution growth method may have a higher temperature. The temperature of wavelength conversion device 100 may also rise when wavelength conversion device 100 is in use. In wavelength conversion device 100 according to the present exemplary embodiment, linear expansion coefficient $\alpha 2$ of filler particles 23 is larger than linear expansion coefficient $\alpha 1$ of matrix 21. Therefore, when the temperature of wavelength conversion device 100 decreases, filler particles 23 contract more than matrix 21. Accordingly, void 25 is created between each filler particle 23 and matrix 21, as illustrated in FIG. 4. Void 25 included in matrix 21 causes matrix 21 to easily deform according to deformation of substrate 10. This configuration decreases stress produced between substrate 10 and matrix 21. Filler particles 23 having rubber elasticity deform in response to deformation of substrate 10. That is, filler particles 23 having the rubber elasticity allows matrix 21 to easily deform according to the deformation of substrate 10. This configuration decreases stress produced between substrate 10 and matrix 21. The decreased stress between substrate 10 and matrix 21 suppresses the warping of substrate 10.

Exemplary Embodiment 2

Figure 5:
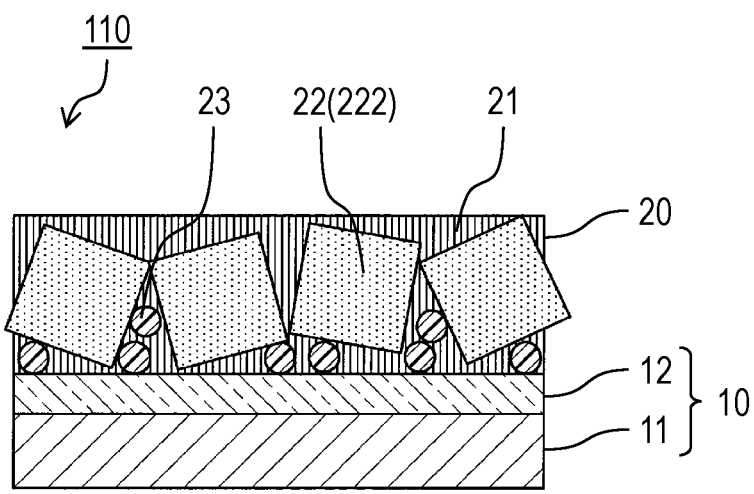
FIG. 5 is a schematic sectional view of a wavelength conversion device according to Exemplary Embodiment 2 of the present disclosure.

FIG. 5 is a schematic sectional view of wavelength conversion device 110 according to Exemplary Embodiment 2. As illustrated in FIG. 5, phosphor 22 of wavelength conversion device 110 is made of blocks 222. Phosphor part 20 includes phosphor 22 and has portions of phosphor 22 partially exposed. Wavelength conversion device 110 has a structure similar to that of wavelength conversion device 100 according to Embodiment 1. Therefore, those elements common to wavelength conversion device 100 according to Embodiment 1 and wavelength conversion device 110 according to the present embodiment are denoted by the same reference numerals and will not be described. In other words, descriptions of the following exemplary embodiments can be applied to one another as long as there is no technical inconsistency. As long as there is no technical inconsistency, the exemplary embodiments may be combined.

Each block 222 of phosphor 22 has, for example, a polyhedron shape. Block 222 of phosphor 22 may have rectangular-parallelepiped shapes or cubic shapes. Block 222 of phosphor 22 may have a lumpy shape. Blocks 222 of phosphor 22 may be formed by, for example, crushing a phosphor with a plate shape. Block 222 of phosphor 22 may have a larger size than phosphor particle 122.

The portions of phosphor 22 are partially exposed to surfaces of phosphor part 20 of wavelength conversion device 110. Phosphor 22 may be exposed to an upper surface of phosphor part 20. In other words, phosphor 22 may be partly embedded in matrix 21 and thus is not necessarily entirely embedded.

Exemplary Embodiment 3

Figure 6:
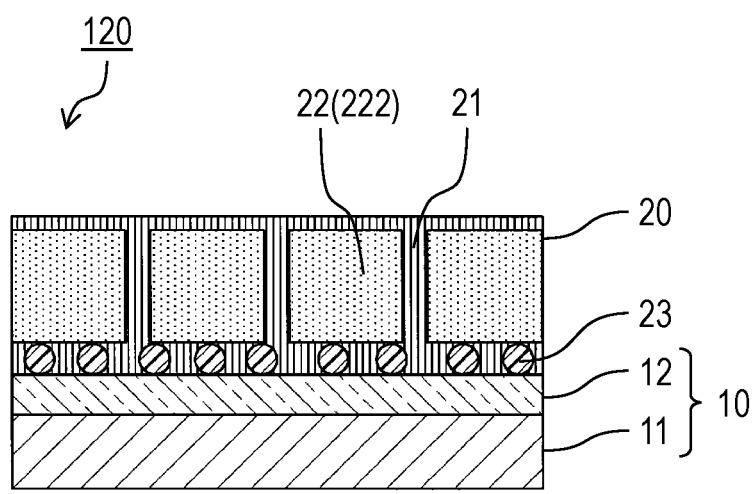
FIG. 6 is a schematic sectional view of a wavelength conversion device according to Exemplary Embodiment 3 of the present disclosure.

Phosphors 22 of wavelength conversion device 110 according to Embodiment 2 may be arranged regularly. FIG. 6 is a schematic sectional view of wavelength conversion device 120 according to Exemplary Embodiment 3. As illustrated in FIG. 5, phosphors 22 of wavelength conversion device 120 are arranged with equal spaces in a direction perpendicular to a thickness of phosphor part 20. Upper surfaces and lower surfaces of phosphors 22 may extend along the direction perpendicular to the thickness of phosphor part 20. The upper surfaces of phosphors 22 may be parallel to the lower surfaces of phosphors 22. Sides of phosphor 22 may extend along the thickness of phosphor part 20. The sides of phosphor 22 may be parallel to one another.

Filler particles 23 are disposed, for example, between substrate 10 and each of the lower surfaces of phosphors 22. Filler particles 23 may be disposed between a side of one phosphor 22 and a side of another phosphor 22.

Phosphor part 20 of wavelength conversion device 120 may have portions of phosphor 22 exposed. Phosphor 22 may be exposed to an upper surface of phosphor part 20. In other words, phosphor 22 may be partly embedded in matrix 21, and thus is not necessarily embedded entirely.

Exemplary Embodiment 4

Figure 7:
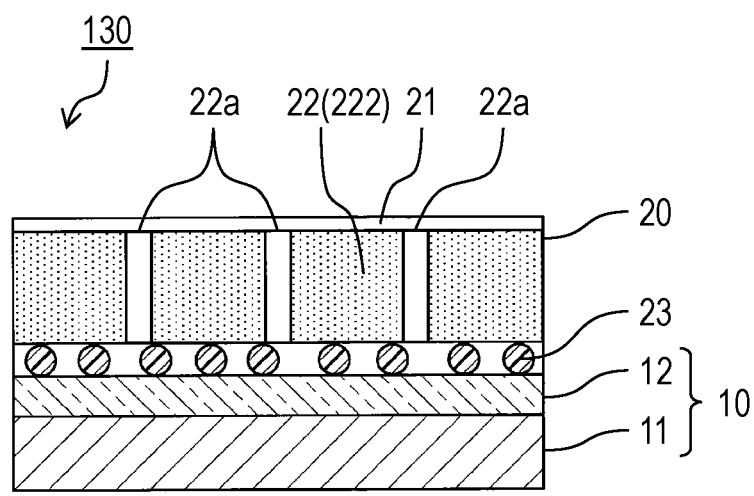
FIG. 7 is a schematic sectional view of a wavelength conversion device according to Exemplary Embodiment 4 of the present disclosure.

FIG. 7 is a schematic sectional view of wavelength conversion device 130 according to Exemplary Embodiment 4. As illustrated in FIG. 6, phosphor 22 is included as a single solid in phosphor part 20 of wavelength conversion device 130. Phosphor 22 has, for example, a plate shape. Phosphor 22 with the plate shape may have a larger size than phosphor particle 122. Wavelength conversion device 130 is otherwise similar in structure to wavelength conversion device 100 according to Embodiment 1.

Phosphor 22 may have plural holes 22a therein. Holes 22a are, for example, through-holes passing through phosphor 22 along a thickness of phosphor 22. In an example, matrix 21 fills holes 22a. In FIG. 6, matrix 21 is not hatched for explanation thereof.

Holes 22a may be formed by, for example, radiating a laser beam or an ion beam to phosphor 2 having the plate shape. Holes 22a may formed by, for example, etching phosphor 22 with the plate shape.

Filler particles 23 are disposed, for example, between substrate 10 and a lower surface of phosphor 22. Phosphor 22 included in phosphor part 20 may be made of plural plates. The plates of phosphor 22 may be arranged along a thickness of phosphor part 20 in phosphor part 20. Filler particles 23 may be disposed between an upper surface of phosphor 22 and a lower surface of another phosphor 22.

Phosphor part 20 of wavelength conversion device 130 may have an upper surface of plate-shaped phosphor 22 exposed. Phosphor part 20 may have sides of plate-shaped phosphor 22 exposed. In other words, plate-shaped phosphor 22 may be partly embedded in matrix 21 and thus is not necessarily embedded entirely.

Exemplary Embodiment 5

Holes 22a of wavelength conversion device 130 according to Embodiment 4 are not necessarily the through-holes. FIG. 7 is a schematic sectional view of wavelength conversion device 140 according to Exemplary Embodiment 5. As shown in FIG. 7, holes 22a of wavelength conversion device 140 open only to a lower surface of phosphor 22 and not to an upper surface of phosphor 22. Holes 22a may open only to the upper surface of phosphor 22 and to the lower surface of phosphor 22.

Phosphor part 20 of wavelength conversion device 140 may have the upper surface of plate-shaped phosphor 22 exposed. Phosphor part 20 may have sides of plate-shaped phosphor 22 exposed. In other words, plate-shaped phosphor 22 may be partly embedded in matrix 21 and thus is not necessarily embedded entirely.

Optical Device According to Exemplary Embodiment

Figure 8:
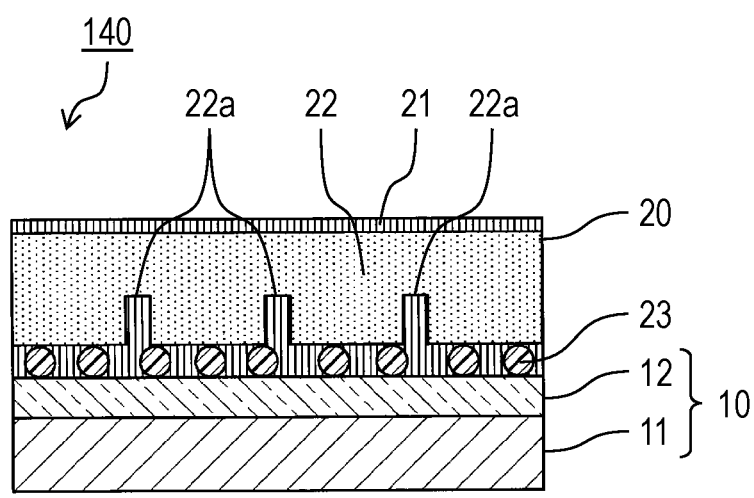
FIG. 8 is a schematic sectional view of a wavelength conversion device according to Exemplary Embodiment 5 of the present disclosure.
Figure 9:
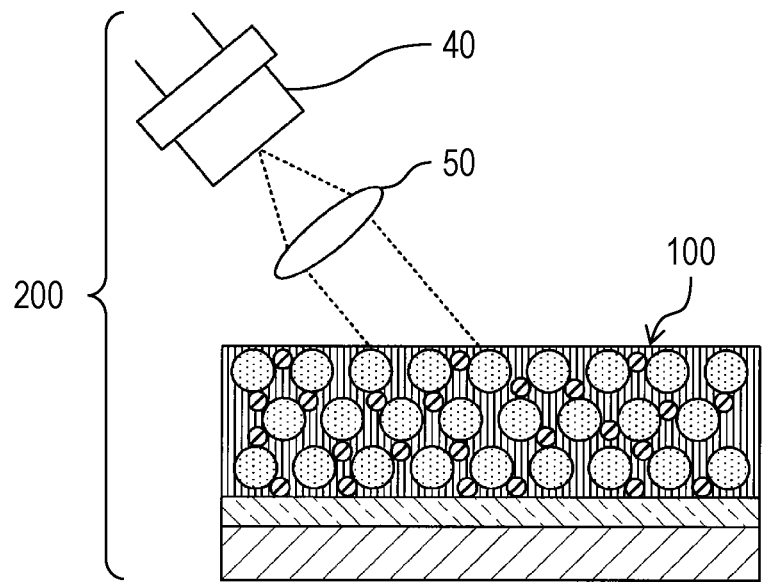
FIG. 9 is a schematic sectional view of a reflective optical device including the wavelength conversion device according to the present disclosure.

FIG. 9 is a schematic sectional view of optical device 200 according to an exemplary embodiment. As shown in FIG. 8, optical device 200 includes wavelength conversion device 100 and excitation light source 40. Excitation light source 40 is configured to emit excitation light. Wavelength conversion device 100 is disposed on an optical path along which the excitation light emitted from excitation light source 40 runs. Phosphor part 20 of wavelength conversion device 100 is positioned between excitation light source 40 and substrate 10 of wavelength conversion device 100. Optical device 200 is a reflective optical device. Also usable instead of wavelength conversion device 100 is wavelength conversion device 120 described with reference to FIG. 5, wavelength conversion device 130 described with reference to FIG. 6, or wavelength conversion device 140 described with reference to FIG. 7. A combination of wavelength conversion devices 100, 110, 120, 130, 140 is also usable in optical device 200.

Excitation light source 40 is typically a semiconductor light-emitting device. The semiconductor light-emitting device may be a light-emitting diode (LED), a superluminescent diode (SLD), or a laser diode (LD).

Excitation light source 40 may be a single LD or may be composed of plural LDs. The LDs may be optically coupled. Excitation light source 40 is configured to emit, for example, blue light. In the present disclosure, the blue light has a peak wavelength ranging from 420 nm to 470 nm.

Optical device 200 may further include optical system 50. Optical system 50 may be positioned on the optical path of the excitation light emitted from excitation light source 40. Optical system 50 includes optical components such as a lens, a mirror, and an optical fiber.

Modification of Optical Device

Phosphor part 20 is not necessarily disposed between excitation light source 40 and substrate 10 of wavelength conversion device 100. FIG. 9 is a schematic sectional view of optical device 210 according to a modification. In FIG. 9, excitation light source 40 of optical device 210 faces substrate 10 of wavelength conversion device 100. In optical device 210, substrate 10 transmits excitation light. The excitation light passes through substrate 10 and reaches phosphor part 20. Optical device 210 is a transmissive optical device.

Other Modifications of Optical Device

Figure 10:
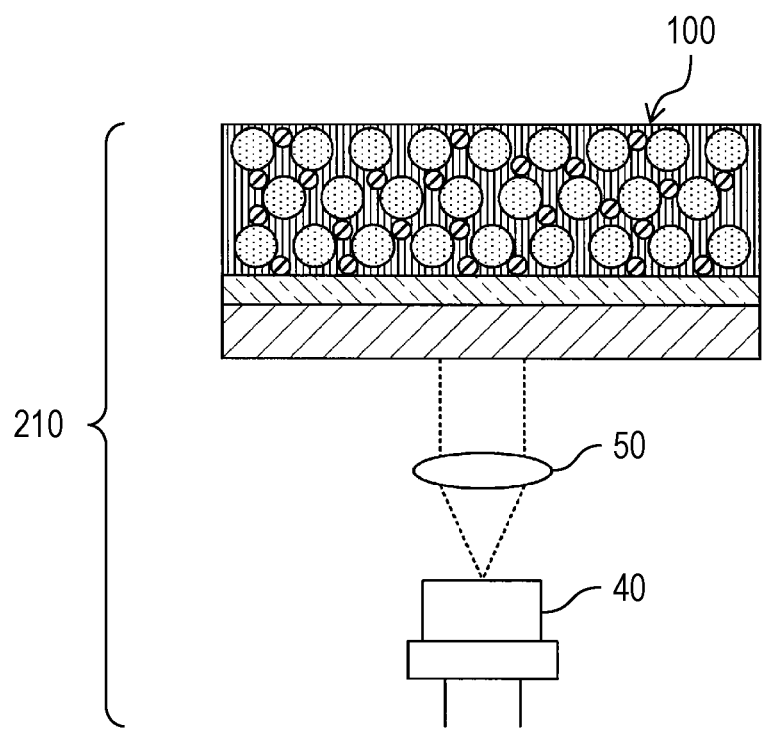
FIG. 10 is a schematic sectional view of a transmissive optical device including the wavelength conversion device according to the present disclosure.
Figure 11:
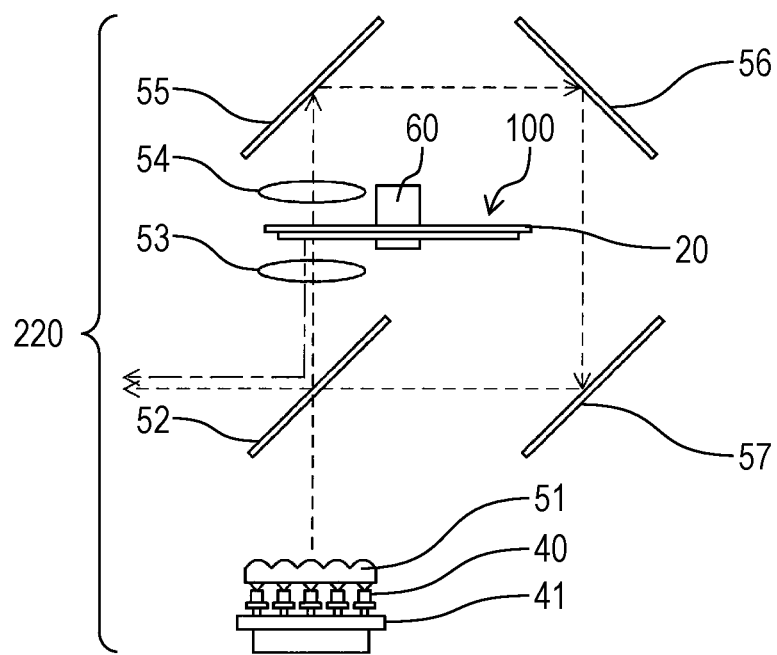
FIG. 11 schematically illustrates an optical device according to a modification of the present disclosure.

FIG. 11 is a schematic sectional view of optical device 220 according to another modification. As shown in FIG. 11, optical device 220 according to the modification includes plural excitation light sources 40 and wavelength conversion device 100. In FIG. 10, phosphor part 20 of wavelength conversion device 100 is positioned between substrate 10 of wavelength conversion device 100 and each of excitation light sources 40. Excitation light sources 40 face phosphor part 20 of wavelength conversion device 100. Optical device 220 is suitable for use in a projector.

Figure 12:
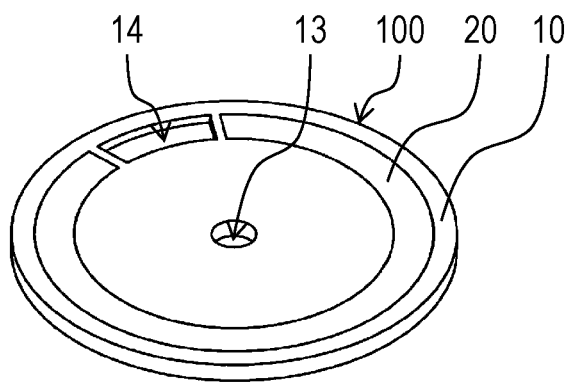
FIG. 12 is a perspective view of the wavelength conversion device of the optical device illustrated in FIG. 11.

FIG. 12 is a perspective view of wavelength conversion device 100 included in optical device 220. As shown in FIG. 12, wavelength conversion device 100 of optical device 220 has a wheel shape. Specifically, substrate 10 of wavelength conversion device 100 of optical device 220 has a disk shape. Substrate 10 has through hole 13 therein and includes light-transmitting part 14. Through hole 13 extends along a thickness of substrate 10. Through hole 13 is positioned, for example, at a center of a virtual circle defined by an outer peripheral surface of substrate 10. Light-transmitting part 14 transmits light and has an arcuate shape, that is, an annular fan shape. Light-transmitting part 14 may contact phosphor part 20. Light-transmitting part 14 is, for example, a through-hole. Light-transmitting part 14 may be made of transparent resin or glass. Light-transmitting part 14 may be made of material, such as sapphire or quartz, having a light transmitting property.

Phosphor part 20 has an arcuate shape, that is, an annular fan shape. Phosphor part 20 and light-transmitting part 14 are arranged along a virtual circle defined by an outer circumferential surface of phosphor part 20. A main surface of substrate 10 is partly covered with phosphor part 20. Wavelength conversion device 100 of optical device 220 may include plural phosphor parts 20. Phosphor parts 20 may be arranged along a virtual circle defined by an outer circumferential surface of specified phosphor part 20. Phosphor parts 20 may include phosphors 22 with different compositions.

As illustrated in FIG. 11, optical device 220 may further include motor 60. Wavelength conversion device 100 is disposed on motor 60. Specifically, a shaft of motor 60 is inserted into through hole 13 of substrate 10. Wavelength conversion device 100 is fixed to motor 60 with a fixing device, such as a screw. While being rotated by motor 60, wavelength conversion device 100 is irradiated with excitation light emitted from excitation light sources 40. Phosphor part 20 are be prevented from being locally irradiated with the excitation light. This configuration prevents the temperature of phosphor part 20 from raising due to the excitation light and fluorescence light.

Optical device 220 may further include collimator lens 51, dichroic mirror 52, lenses 53 and 54, and reflecting mirrors 55, 56, and 57. Collimator lens 51, dichroic mirror 52. Lens 53 is positioned between wavelength conversion device 100 and each of excitation light sources 40. Collimator lens 51, dichroic mirror 52, and lens 53 are arranged in this order on an optical path of the excitation light emitted from excitation light sources 40. Lens 54, reflecting mirrors 55, 56, and 57, and dichroic mirror 52 are arranged in this order on an optical path along which the excitation light transmitted by wavelength conversion device 100 travels.

Collimator lens 51 focuses the excitation light emitted by plural excitation light sources 40 to provide collimated light. Dichroic mirror 52 transmits the excitation light and efficiently reflecting the light emitted from wavelength conversion device 100. Lens 53 focuses the excitation light and the light emitted from wavelength conversion device 100. Lens 54 focuses the excitation light transmitted by wavelength conversion device 100, providing collimated light. Reflecting mirrors 55, 56, and 57 reflect the excitation light.

Optical device 220 may further include heat sink 41. Heat sink 41 contacts excitation light sources 40. Heat sink 41 readily transmits heat from excitation light sources 40. This configuration reduced or prevents increase of temperature of excitation light sources 40, accordingly reducing or preventing decrease in energy conversion efficiency of excitation light sources 40.

An operation of optical device 220 will be described below.

Excitation light sources 40 emit the excitation light. The excitation light is focused by collimator lens 51 and is converted into collimated light. Then, the excitation light is transmitted by dichroic mirror 52 and is focused further by lens 53. Lens 53 adjusts a spot diameter of the excitation light incident on phosphor part 20. Next, the excitation light enters into wavelength conversion device 100. Wavelength conversion device 100 rotated by motor 60. Therefore, the operation of optical device 220 includes a period during which the excitation light is incident on phosphor part 20 and a period during which the excitation light is transmitted by light-transmitting part 14. While the excitation light is incident on phosphor part 20, wavelength conversion device 100 emits light with the longer wavelength than the excitation light. In the period during which the excitation light is transmitted by light-transmitting part 14, the excitation light enters into lens 54. The light emitted from wavelength conversion device 100 is focused by lens 53 and is converted into collimated light. The light emitted from wavelength conversion device 100 reflects on dichroic mirror 52 and is transmitted outside optical device 220.

The excitation light transmitted by light-transmitting part 14 is focused by lens 54 and is converted into the collimated light. The excitation light that has passed through lens 54 reflects on reflecting mirrors 55, 56, and 57. Then, the excitation light is transmitted by dichroic mirror 52. The excitation light is thus output from optical device 220. At this moment, the excitation light is mixed with the light emitted from wavelength conversion device 100.

Projector According to Exemplary Embodiment

Figure 13:
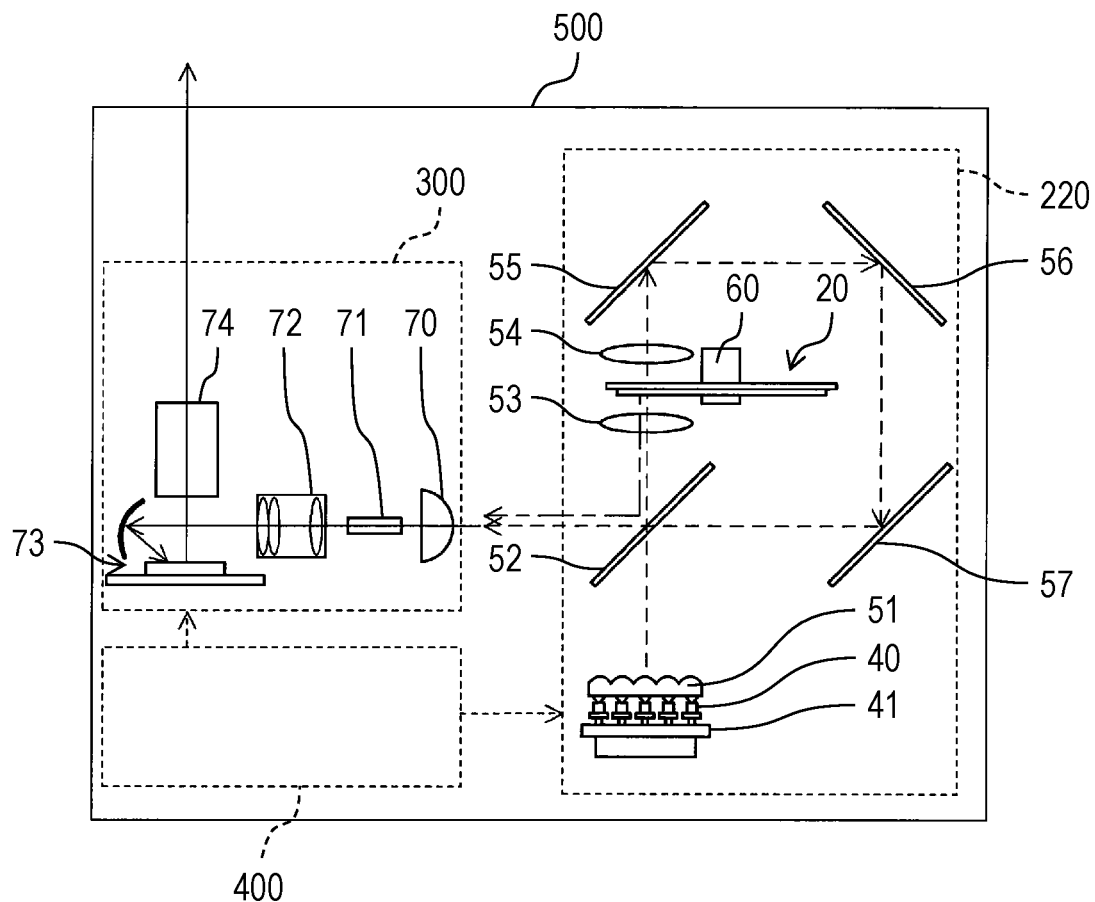
FIG. 13 schematically illustrates a projector including the optical device according to the present disclosure.

FIG. 13 is a schematic diagram of projector 500 according to the embodiment. As illustrated in FIG. 13, projector 500 includes optical device 220, optical unit 300, and controller 400. Optical unit 300 converts light emitted from optical device 220 and projects an image or video onto an object outside projector 500. The object may be a screen. Optical unit 300 includes converging lens 70, rod integrator 71, lens unit 72, display device 73, and projector lens 74.

Converging lens 70 converges the light emitted from optical device 220. The light emitted from optical device 220 thus converges to an end surface of rod integrator 71 at incidence side.

Rod integrator 71 has, for example, a quadrangular prism shape. The light incident on the incidence end surface of rod integrator 71 repeats total reflections inside rod integrator 71 and is emitted from an emission end surface of rod integrator 71. The light exited from rod integrator 71 has a uniform luminance distribution.

Lens unit 72 includes plural lenses. The lenses of lens unit 72 A may include a condenser lens and a relay lens. Lens unit 72 guides the light exited from rod integrator 71 to display device 73.

Display device 73 converts the light that has passed through lens unit 72. Consequently, the image or the video is obtained for projection onto the object outside projector 500. Display device 73 is, for example, a digital mirror device (DMD).

Projector lens 74 projects the light converted by display device 73 to outside projector 500. The light converted by display device 73 is thus projected onto the object. Projector lens 74 includes one or more lenses. The lenses included in projector lens 74 may include a biconvex lens and a plano-concave lens.

Controller 400 is configured to control optical device 220 and optical unit 300. Controller 400 is implemented by, for example, a microcomputer or a processor.

Figure 14:
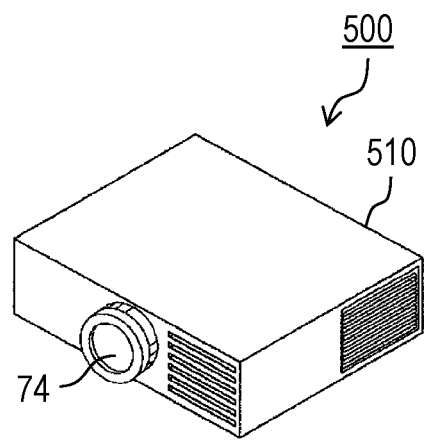
FIG. 14 is a perspective view of the projector illustrated in FIG. 13.

FIG. 14 is a perspective view of projector 500. As illustrated in FIG. 13, projector 500 further includes housing 510. Housing 510 accommodates therein optical device 220, optical unit 300, and controller 400. A part of projector lens 74 of optical unit 300 is exposed from the hosing as an external part of housing 510.

Lighting Device According to Exemplary Embodiment

Figure 15:
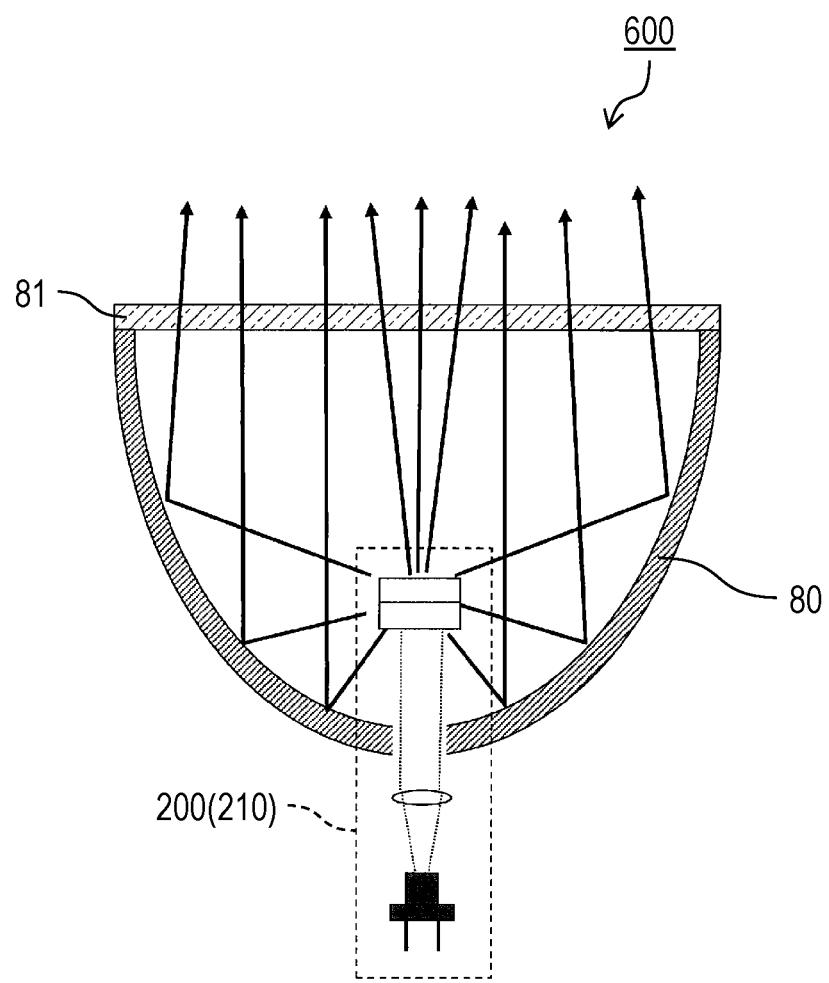
FIG. 15 schematically illustrates a lighting device including the optical device according to the present disclosure.

FIG. 15 is a schematic diagram of lighting device 600 according to the embodiment. As illustrated in FIG. 15, lighting device 600 includes optical device 200 and optical component 80. Optical device 210 described with reference to FIG. 10 is also a usable alternative to optical device 200. Optical component 80 is configured to guide forwards light emitted from optical device 200, and is specifically a reflector. Optical component 80 includes, for example, a film made of metal, such as Al or Ag, or an Al film having surfaces having a dielectric layer provided thereon. Filter 81 may be provided in front of optical device 200. Filter 81 absorbs or scatters coherent blue light from the excitation light source of optical device 200 to prevent the blue light from being output directly from the excitation light source. Lighting device 600 may be a so-called reflector or a projector. Lighting device 600 is, for example, a vehicle headlamp.

EXAMPLES

The present disclosure will be described on the basis of examples. The following examples are not in any way restrictive of the present disclosure.

Filler Particles

Samples 1 to 5

Filler particles of samples 1 to 5 were prepared. Filler particles of sample 1 was made of alumina. A linear expansion coefficient of filler particles of sample 1 was 7.5 ppm/K. Filler particles of sample 2 was made of polystyrene. A linear expansion coefficient of filler particles of sample 2 was 65 ppm/K. Filler particles of sample 3 was made of polymethyl methacrylate (PMMA). A linear expansion coefficient of filler particles of sample 3 was 70 ppm/K. Filler particles of sample 4 was silicone composite particles each including a core made of silicone rubber and a shell made of silicone resin other than silicone rubber. A linear expansion coefficient of filler particles of sample 4 was 286 ppm/K. Filler particles of sample 5 was made of silicone rubber. A linear expansion coefficient of filler particles of sample 5 was 300 ppm/K.

Light Absorptivity of Filler Particles

An absorptivity of filler particles from each of samples 1 to 5 was measured both for light with a wavelength of 450 nm and light with a wavelength of 550 nm. An absolute PL quantum yield measurement device (C9920-02G manufactured by Hamamatsu Photonics K.K.) was used to measure the absorptivity. In the absorptivity measurement, a petri dish made of synthetic quartz was used. The bottom of the petri dish had a circular shape in plan view. In plan view, the bottom of the petri dish had a diameter of about 17 mm. The petri dish had a thickness of about 5 mm. The petri dish included a lid. Table 5 shows measurement results.

When the filler particles had the absorptivity less than or equal to 10% for the light with the wavelength of 550 nm, their heat resistance was rated "good" (denoted by "G") in Table 2. When the filler particles had the absorptivity of greater than 10% and less than or equal to 25% for the light with the wavelength of 550 nm, their heat resistance was rated "moderately good" (denoted by "F"). When the filler particles had the absorptivity of greater than 25% for the light with the wavelength of 550 nm, their heat resistance was rated "poor" (denoted by "NG").

Heat Resistance of Filler Particles at 200° C.

Samples 1 to 5 of filler particles were heated at an ambient temperature of 200° C. for 24 hours. An absorptivity of the heated filler particles was measured both for light with a wavelength of 450 nm and for light with a wavelength of 550 nm in the same way as described above. Table 5 shows measurement results.

When the filler particles had the absorptivity of less than or equal to 10% for the light with the wavelength of 550 nm, their heat resistance at 200° C. was rated "good" (denoted by "G") in Table 5. When the filler particles had the absorptivity of greater than 10% and less than or equal to 25% for the light with the wavelength of 550 nm, their heat resistance at 200° C. was rated "moderately good" (denoted by "F"). When the filler particles had the absorptivity of greater than 25% for the light with the wavelength of 550 nm, their heat resistance at 200° C. was rated "poor" (denoted by "NG").

Heat Resistance of Filler Particles at 240° C.

Samples 1 to 5 of the filler particles were heated at an ambient temperature of 240° C. for 24 hours. An absorptivity of the heated filler particles was measured both for light with a wavelength of 450 nm and for light with a wavelength of 550 nm in the same way as described above. Table 5 shows measurement results.

When the filler particles had the absorptivity of less than or equal to 10% for the light with the wavelength of 550 nm, their heat resistance at 240° C. was rated "good" (denoted by "G") in Table 5. When the filler particles had the absorptivity of greater than 10% and less than or equal to 25% for the light with the wavelength of 550 nm, their heat resistance at 240° C. was rated "moderately good" (denoted by "F"). When the filler particles had the absorptivity of greater than 25% for the light with the wavelength of 550 nm, their heat resistance at 240° C. was rated "poor" (denoted by "NG").

TABLE 5

| Sample | Material | Initial Absorptivity (%) 450 nm | Initial Absorptivity (%) 550 nm | Evaluation of Heat Resistance |
|---|---|---|---|---|
| 1 | Alumina | 0 | 0 | G |
| 2 | Polystyrene | 6.3 | 0.6 | G |
| 3 | PMMA | 3.5 | 0.7 | G |
| 4 | Silicone Rubber Silicone Resin | 0.2 | 0 | G |
| 5 | Silicone Rubber | 0 | 0 | G |

| Sample | Material | Absorptivity (%) after Heating at 200° C. 450 nm | Absorptivity (%) after Heating at 200° C. 550 nm | Evaluation of Heat Resistance at 200° C. |
|---|---|---|---|---|
| 1 | Alumina | 0 | 0 | G |
| 2 | Polystyrene | 55.9 | 29.8 | NG |
| 3 | PMMA | 24.0 | 10.3 | F |
| 4 | Silicone Rubber Silicone Resin | 1.4 | 0.2 | G |
| 5 | Silicone Rubber | — | — | — |

| Sample | Material | Absorptivity (%) after Heating at 240° C. 450 nm | Absorptivity (%) after Heating at 240° C. 550 nm | Evaluation of Heat Resistance at 240° C. |
|---|---|---|---|---|
| 1 | Alumina | 0 | 0 | G |
| 2 | Polystyrene | — | — | — |
| 3 | PMMA | 68.8 | 34.5 | NG |
| 4 | Silicone Rubber Silicone Resin | 1.8 | 1.0 | G |
| 5 | Silicone Rubber | 0 | 0 | G |

As shown in from Table 5, the filler particles of samples 4 and 5 containing silicone rubber or silicone resin had excellent heat resistance.

Wavelength Conversion Device

Comparative Example 1

A wavelength conversion device according to Comparative Example 1 was made by a method below. A substrate body with a reflective layer was prepared first. The substrate body was an aluminum substrate. The substrate body has a disk shape. The substrate body had a through hole therein passing through the substrate body along its thickness. The through hole had a circular shape in plan view. The through hole was located at a center of a virtual circle defined by an outer periphery of a surface of the substrate body. The thickness of the substrate body was 1.0 mm. In plan view, the substrate body had a diameter of 65 mm. In plan view, the through hole had a diameter of 25 mm. The substrate body had a linear expansion coefficient of 23 ppm/K. Next, a crystalline ZnO film was formed on the substrate body. The ZnO film had a ring shape in plan view. The virtual circle defined by the outer periphery of the surface of the substrate body was concentric with a virtual circle defined by an outer periphery of a surface of the ZnO film. The virtual circle defined by the outer periphery of the surface of the ZnO film had a diameter of 62 mm. A virtual circle defined by an inner periphery of the surface of the ZnO film had a diameter of 52 mm.

Next, a phosphor in the form of particles was deposited on the ZnO film. The phosphor was made of $Y_3Al_5O_{12}$:Ce (YAG). The phosphor particles had an average particle diameter of 16 μm. The phosphor had a linear expansion coefficient of 8 ppm/K. Next, a crystalline ZnO matrix was formed on the ZnO film by a solution growth method. A solution used for crystal growth was aqueous solution of zinc nitrate and hexamethylenetetramine. This solution used in the solution growth method had a temperature of 90° C. during the crystal growth, thereby providing the wavelength conversion device according to Comparative Example 1. The wavelength conversion device according to Comparative Example 1 had the phosphor falling from the substrate during the forming the matrix.

Example 1

A wavelength conversion device according to Example 1 was made by the same method as in Comparative Example 1, except that filler particles made of sample 3 were deposited on a ZnO film together with phosphor particles. In the wavelength conversion device according to Example 1, ratio P2 of the total volume of the filler particles to the volume of a phosphor part was 0.029. V2/(V1+V2) determined by total volume V1 of the phosphor particles and total volume V2 of the filler particles was 0.05. The phosphor part of the wavelength conversion device according to Example 1 had a thickness of 60 μm. The matrix of the wavelength conversion device according to Example 1 had a linear expansion coefficient of 3.5 ppm/K.

When the phosphor part was disposed above the substrate, the wavelength conversion device according to Example 1 warped convexly and had a convex surface slightly protruding upward. The wavelength conversion device was placed on a surface plate serving as a reference plane such that the phosphor part was located at the top of the substrate. A part of an upper surface of the substrate located uppermost in a vertical direction was identified as a substrate top of the wavelength conversion device according to Example 1. Apart of the upper surface of the substrate located farthest down in the vertical direction was defined as a substrate valley. The substrate top of the wavelength conversion device according to Example 1 was located near a through hole of the substrate. The substrate valley was located near an outer periphery of a surface of the substrate. A part of a lower surface of the substrate located farthest down in the vertical direction of the wavelength conversion device according to Example 1 was identified as a base. A distance between the substrate top and the base in the vertical direction was determined. A distance between the substrate valley and the base in the vertical direction was determined. A difference between these distances was calculated as an amount of the warping of the substrate. The difference between these distances corresponds with a distance between the substrate top and the substrate valley in vertical direction V. Table 6 shows the calculation result.

Example 2

A wavelength conversion device according to Example 2 was obtained by the same method as Example 1, except that ratio P2 of the volume of the filler particles to the volume of the phosphor part was 0.081. V2/(V1+V2) was 0.14. The amount of the warping of the substrate was calculated for the wavelength conversion device according to Example 2 by the same method as in Example 1. Table 6 shows the calculation result.

Example 3

A wavelength conversion device according to Example 3 was obtained by the same method as in Example 1, except that ratio P2 of the volume of filler particles to the volume of the phosphor part was 0.161. V2/(V1+V2) was 0.28. The amount of the warping of the substrate was calculated for the wavelength conversion device according to Example 3 by the same method as in Example 1. Table 6 shows the calculation result.

TABLE 6

| | Filler Particles | Material of Filler Particles | Amount of Warping |
|---|---|---|---|
| Comparative Example 1 | None | — | Phosphor Fallen |
| Example 1 | Sample 3 5 vol % | PMMA | 45 μm |
| Example 2 | Sample 3 14 vol % | PMMA | 35 μm |
| Example 3 | Sample 3 28 vol % | PMMA | 17 μm |

As shown in Table 6, the higher the proportion of the contained filler particles having the larger linear expansion coefficient than the matrix, the lower the amount of the warping of the substrate.

Ratio of Volume of Filler Particles to Volume of Phosphor Part

Next, a ratio of the volume of the filler particles to the volume of the phosphor part was calculated in the condition that the phosphor part and the substrate had the same linear expansion coefficient.

Calculation Example 1

A substrate body was assumed to be an aluminum substrate. The linear expansion coefficient of the aluminum substrate was 23 ppm/K. A phosphor to use was assumed to be YAG. The linear expansion coefficient of YAG was 8 ppm/K. A matrix to use was assumed to be made of ZnO. The linear expansion coefficient of ZnO was 3.5 ppm/K. Filler particles to use were assumed to be filler particles made of sample 3. The linear expansion coefficient of the filler particles made of sample 3 was 70 ppm/K.

Ratio P1 of the volume of the matrix to the volume of the phosphor part was assumed to be 0.425. Ratio P2 of the total volume of the filler particles to the volume of the phosphor part was 0.273 in the case that a linear expansion coefficient of the phosphor part was equal to the linear expansion coefficient of the substrate. The linear expansion coefficient of the phosphor part was a value calculated by the above-mentioned formula. V2/(V1+V2) determined by the total volume V1 of the phosphor particles of the phosphor and the total volume V2 of the filler particles was 0.475.

Calculation Example 2

In Calculation Example 2, the substrate body to use was assumed to be made of stainless steel (SUS430). A calculation was otherwise similar to that in Calculation Example 1. A linear expansion coefficient of SUS430 was 10.4 ppm/K. Ratio P2 of the volume of the filler particles to the volume of the phosphor part was 0.070 in the case that the linear expansion coefficient of the phosphor part was equal to the linear expansion coefficient of the substrate. V2/(V1+V2) was 0.122.

Calculation Example 3

In Calculation Example 3, the filler particles to use were assumed to be filler particles made of sample 5. A calculation was otherwise similar to that in Calculation Example 1. The linear expansion coefficient of the filler particles made of sample 5 was 300 ppm/K. Ratio P2 of the volume of the filler particles to the volume of the phosphor part was 0.058 in the case that a linear expansion coefficient of a phosphor part was equal to the linear expansion coefficient of the substrate. V2/(V1+V2) was 0.101.

Calculation Example 4

In Calculation Example 4, the substrate body to use was assumed to be made of stainless steel (SUS430). A calculation was otherwise similar to that in Calculation Example 3. Ratio P2 of the volume of the filler particles to the volume of the phosphor part was 0.015 in the case that the linear expansion coefficient of the phosphor part was equal to the linear expansion coefficient of the substrate. V2/(V1+V2) was 0.025.

Based on a comparison between Calculation Examples 1 and 3 and a comparison between Calculation Examples 2 and 4, reduced or no substrate warping is expected in the case that the filler particles is made of sample 5 having the larger linear expansion coefficient than the filler particles made of sample 3 even if the ratio of the volume of the filler particles to the volume of the phosphor part decreases by a certain amount. Based on a comparison between Calculation Examples 1 and 2 and a comparison between Calculation Examples 3 and 4, reduced or no substrate warping is expected in the case that the substrate is made of stainless steel having the smaller linear expansion coefficient than the substrate made of aluminum even if the ratio of the volume of the filler particles to the volume of the phosphor part decreases by a certain amount.

The wavelength conversion device according to the present disclosure includes substrate 10, matrix 21 supported by substrate 10 and containing the inorganic material, phosphor 22 embedded in matrix 21, and filler particles 23 embedded in matrix 21. The linear expansion coefficient of filler particles 23 is equal to or larger than 25 ppm/K and equal to or smaller than 790 ppm/K, and is larger than the linear expansion coefficient of matrix 21.

Filler particles 23 having the larger linear expansion coefficient than matrix 21 contract more than matrix 21. Therefore, as the temperature of the wavelength conversion device decreases, the void is created between each filler particle 23 and matrix 21. The void allows matrix 21 to deform to absorb the deformation of substrate 10. This configuration decreases stress produced in the wavelength conversion device. The decreased stress in the wavelength conversion device causes small or no warping of substrate 10.

The linear expansion coefficient of substrate 10 of the wavelength conversion device may be larger than the linear expansion coefficient of matrix 21 and smaller than the linear expansion coefficient of filler particles 23. The linear expansion coefficient of substrate 10 is thus close to the linear expansion coefficient of phosphor part 20 including matrix 21 and filler particles 23. Therefore, the amount of contraction of substrate 10 is substantially the same as the amount of contraction of phosphor part 20. This configuration reduces stress produced in the wavelength conversion device, accordingly reducing the warping of substrate 10.

The linear expansion coefficient of matrix 21 may be, for example, less than or equal to 9.8 ppm/K. Consequently, the warping of substrate 10 is reduced further or prevented.

The linear expansion coefficient of substrate 10 may be, for example, equal to or larger than 9.9 ppm/K and equal to or smaller than 17.8 ppm/K. Consequently, the warping of substrate 10 is reduced further or prevented.

Filler particles 23 may, for example, contain the polymer compound including the siloxane bonds. Consequently, filler particles 23 have the excellent heat resistance.

Filler particles 23 may, for example, have rubber elasticity. This enables filler particle 23 to deform themselves. Accordingly, matrix 21 can deform according to deformation of substrate 10, thus decreasing stress in the wavelength conversion device. Consequently, the warping of substrate 10 is reduced further or prevented.

The absorptivity of filler particles 23 is preferably less than or equal to 25%, for example, for the light with the wavelength of 550 nm. Consequently, the wavelength conversion device has a high light emission efficiency.

Matrix 21 may contain the inorganic crystal. Consequently, matrix 21 provides excellent heat dissipation.

The inorganic crystal may include zinc oxide. Consequently, matrix 21 provides better heat dissipation.

That zinc oxide mentioned above may be c-axis oriented in the wavelength conversion device. Consequently, matrix 21 provides even better heat dissipation.

Optical device 200 (210, 220) includes wavelength conversion device 100 (110, 120, 130, 140) and excitation light source 40 configured to irradiate the wavelength conversion device with excitation light. This optical device has excellent light emission efficiency.

Projector 500 includes wavelength conversion device 100 (110, 120, 130, 140). Projector 500 has excellent light emission efficiency.

INDUSTRIAL APPLICABILITY

A wavelength conversion device according to the present disclosure is usable, for example, in light sources of those including: general lighting devices such as ceiling lights; special lighting devices such as spotlights, stadium lighting, and studio lighting; lighting devices for vehicles, such as headlamps; projection devices such as projectors and head-up displays; endoscope lighting devices for medical or industrial use; imaging devices such as digital cameras, mobile phones, and smartphones; and liquid-crystal display devices such as personal computer (PC) monitors, notebook personal computers, televisions, personal digital assistants (PDXs), the smartphones, tablet PCs, and the mobile phones.

REFERENCE MARKS IN THE DRAWINGS 10 substrate
11 substrate body
12 film
20 phosphor part
21 matrix
22 phosphor
23 filler particle
40 excitation light source
100, 110, 120, 130, 140 wavelength conversion device
200, 210, 220 optical device
500 projector
600 lighting device

The invention claimed is:
1. A wavelength conversion device comprising:
a substrate;
a matrix supported by the substrate, the matrix containing inorganic material;
a phosphor embedded in the matrix; and filler particles embedded in the matrix,
wherein a linear expansion coefficient of the filler particles is equal to or larger than 25 ppm/K and equal to or smaller than 790 ppm/K, and is larger than a linear expansion coefficient of the matrix.

2. The wavelength conversion device according to claim 1, wherein a linear expansion coefficient of the substrate is larger than the linear expansion coefficient of the matrix, and is smaller than the linear expansion coefficient of the filler particles.

3. The wavelength conversion device according to claim 1, wherein the linear expansion coefficient of the matrix is equal to or smaller than 9.8 ppm/K.

4. The wavelength conversion device according to claim 1, wherein a linear expansion coefficient of the substrate is equal to or larger than 9.9 ppm/K and equal to or smaller than 17.8 ppm/K.

5. The wavelength conversion device according to claim 1, wherein the filler particles contain polymer compound including siloxane bond.

6. The wavelength conversion device according to claim 1, wherein the filler particles have rubber elasticity.

7. The wavelength conversion device according to claim 1, wherein the filler particles have absorptivity equal to or less than 25% to light with a wavelength of 550 nm.

8. The wavelength conversion device according to claim 1, wherein the matrix contains inorganic crystal.

9. The wavelength conversion device according to claim 8, wherein the inorganic crystal contains zinc oxide.

10. The wavelength conversion device according to claim 9, wherein the zinc oxide is c-axis oriented.

11. An optical device comprising:
the wavelength conversion device according to claim 1; and
an excitation light source configure to irradiate the wavelength conversion device with excitation light.

12. A projector comprising the wavelength conversion device according to claim 1.

* * * * *